United States Patent
Ouchi

(10) Patent No.: US 6,853,442 B2
(45) Date of Patent: Feb. 8, 2005

(54) PROJECTION EXPOSURE APPARATUS AND DEVICE MANUFACTURING METHOD THAT CHANGE A RESONATOR LENGTH OF A CONTINUOUS EMISSION EXCIMER LASER

(75) Inventor: Chidane Ouchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 72 days.

(21) Appl. No.: 09/986,324

(22) Filed: Nov. 8, 2001

(65) Prior Publication Data

US 2002/0131030 A1 Sep. 19, 2002

(30) Foreign Application Priority Data

Nov. 10, 2000 (JP) ........................................ 2000-344525

(51) Int. Cl.⁷ .......................... G03B 27/72; G03B 27/54
(52) U.S. Cl. ......................................... 355/69; 355/67
(58) Field of Search ............................... 355/69, 55, 67; 372/20; 382/144; 353/69; 438/7, 16; 250/422.2

(56) References Cited

U.S. PATENT DOCUMENTS

| | | | | |
|---|---|---|---|---|
| 4,736,381 A | * | 4/1988 | Eden et al. | 372/56 |
| 4,811,055 A | | 3/1989 | Hirose | 355/53 |
| 4,891,663 A | | 1/1990 | Hirose | 355/53 |
| 4,952,945 A | * | 8/1990 | Hikima | 347/247 |
| 5,170,207 A | * | 12/1992 | Tezuka et al. | 355/53 |

FOREIGN PATENT DOCUMENTS

| | | |
|---|---|---|
| EP | 0 820 132 A2 | 1/1998 |
| JP | 7-142385 | 6/1995 |
| JP | 9-214023 | 8/1997 |
| JP | 10-163547 | 6/1998 |
| JP | 11-298083 | 10/1999 |

\* cited by examiner

*Primary Examiner*—Peter B. Kim
(74) *Attorney, Agent, or Firm*—Fitzpatrick, Cella, Harper & Scinto

(57) ABSTRACT

A projection exposure apparatus includes a continuous emission excimer laser for providing laser light having a predetermined wavelength, an illumination optical system for illuminating a pattern of a reticle with laser light having the predetermined wavelength, a projection optical system for projecting the illuminated pattern of the reticle onto a substrate, wherein the projection optical system is provided by a lens system made of a substantially single glass material, a laser for injecting light having the predetermined wavelength into a resonator of the continuous emission excimer laser, a wavemeter for measuring the wavelength of the laser light from the continuous emission excimer laser, and a changing device for changing a resonator length of the continuous emission excimer laser on the basis of a signal from the wavemeter so that the wavelength of the laser light from the continuous emission excimer laser becomes equal to the predetermined wavelength.

10 Claims, 10 Drawing Sheets

PROJECTION EXPOSURE APPARATUS AND DEVICE MANUFACTURING METHOD THAT CHANGE A RESONATOR LENGTH OF A CONTINUOUS EMISSION EXCIMER LASER

FIELD OF THE INVENTION AND RELATED ART

This invention relates to a projection exposure apparatus and a device manufacturing method using the same. More particularly, the invention concerns a projection exposure apparatus and a device manufacturing method which are suitably usable at a projection exposure step in a photolithographic process, specifically for the manufacture of semiconductor devices such as ICs or LSIs, image pickup devices such as CCD, display devices such as liquid crystal panel, and magnetic head devices, for example. In the present invention, a continuous emission excimer laser is used as a light source for transferring a pattern of a reticle onto a photosensitive substrate.

A continuous emission excimer laser can be used as a light source in the manufacture of semiconductor devices or other devices such as liquid crystal panel, for example, based on the photolithographic technology (Japanese Laid-Open Patent Application, Laid-Open No. 163547/1998).

The aforementioned Japanese patent application document discloses use of an incoherency transforming system in which speckle patterns are removed by use of a rotary diffusion plate provided in an illumination optical system for illuminating a reticle. However, this document does not specifically refer to how to construct a projection optical system for projecting the circuit pattern of the reticle.

Continuous emission excimer lasers have a very narrow half bandwidth of a wavelength spectrum, such as 1 pm or less. In consideration of it, the projection optical system maybe provided by a monochromatic lens system (without chromatic aberration correction), all being made of a single glass material. However, excimer lasers have a characteristic that the wavelength spectrum (wavelength) of laser light is variable. Therefore, if a monochromatic lens system is used, there would occur a variation in the optical characteristic of the lens system, such as magnification, focal point position and aberration, for example, due to changes in the wavelength spectrum. This leads to a problem that a circuit pattern of a reticle cannot be projected on a wafer exactly.

Particularly, there is a serious problem in continuous emission excimer lasers that the emission wavelength does not always correspond to a design value, just from start of the light emission.

SUMMARY OF THE INVENTION

It is accordingly an object of the present invention to provide a projection exposure apparatus and a device manufacturing method using the same, in which the emission wavelength of a continuous emission excimer laser can be held at a design wavelength, just from start of the emission.

In accordance with an aspect of the present invention, there is provided a projection exposure apparatus in which a pattern of a reticle is illuminated with laser light of a predetermined wavelength, from a continuous emission excimer laser, and the illuminated pattern is projected onto a substrate by use of a projection optical system. The projection optical system may comprise a lens system made of a substantially single glass material. The apparatus may also comprise a pulse emission laser for injecting pulse light into the continuous emission excimer laser.

In accordance with a further aspect of the present invention, there is provided a device manufacturing method which may comprise an exposure process for exposing a substrate to a device pattern by means of a projection exposure apparatus as recited above, and a developing process for developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 1:
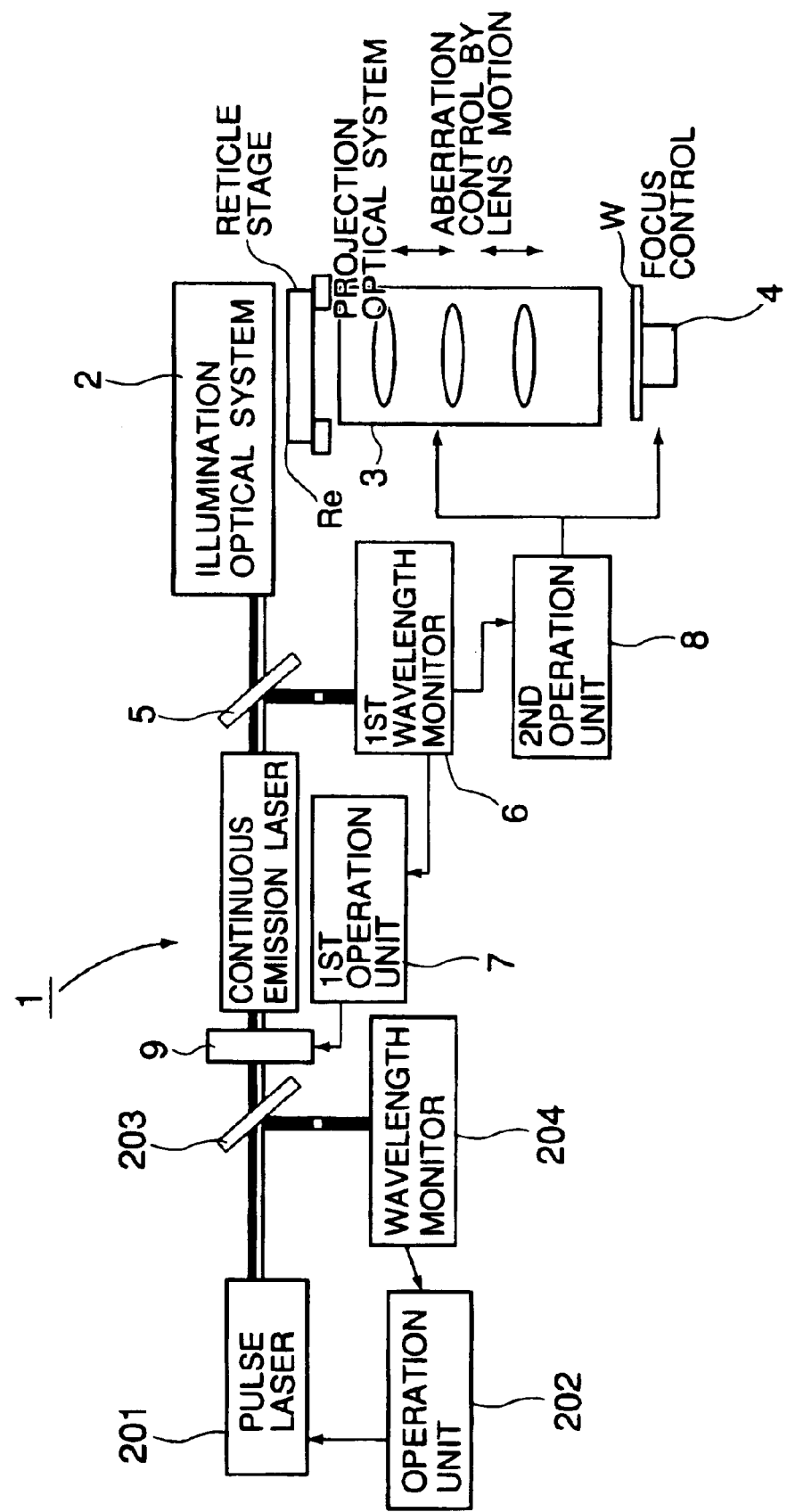
FIG. 1 is a schematic view of a main portion of a projection exposure apparatus according to a first embodiment of the present invention.

FIG. 1 is a schematic view of a projection exposure apparatus according to a first embodiment of the present invention. In this embodiment, the invention is applied to a step-and-scan type scanning projection exposure apparatus having a resolution 0.13 micron or less, being usable for production of various devices such as semiconductor devices, liquid crystal devices, image pickup devices and magnetic heads, for example.

Denoted in FIG. 1 at 1 is an ArF excimer laser of continuous emission type, having a center wavelength 193 nm and a half bandwidth 0.2 pm or less, preferably, not greater than 0.1 pm. Denoted at 5 is a half mirror (semi-transmission mirror) and denoted at 2 is an illumination optical system for illuminating a reticle Re having a circuit pattern formed thereon, with use of laser light from the laser 1. Denoted at 3 is a projection optical system for projecting a reduced image of the circuit pattern of the reticle Re, onto a wafer W. The projection optical system 3 is provided by a lens system being made of a substantially single glass material. Denoted at 4 is a movable stage being movable while holding a wafer W thereon.

In the projection apparatus of FIG. 1, in relation to each shot area on the wafer W, the reticle Re is illuminated with slit-like illumination light of a rectangular or arcuate sectional shape. Also, in regard to the widthwise direction of the slit-like section of this illumination light, the reticle Re and the wafer W are scanningly moved in mutually opposite directions, along a direction orthogonal to the optical axis of the projection optical system 3, and at a speed ratio the same as the projection magnification of the projection optical system 3. With this procedure, the circuit pattern of the reticle Re is projected and printed on each shot area on the wafer W.

The projection exposure apparatus of this embodiment is provided with a mechanism for injecting pulse light, as produced by a pulse emission ArF excimer laser 201 having a center wavelength 193 nm and a half bandwidth not greater than 1 pm, into the continuous emission excimer laser 1, such that the emission wavelength of the continuous excimer laser 1 can be held at the emission wavelength of the pulse light. This procedure is called injection locking.

In continuous emission excimer lasers, in some cases it takes a substantial time until, after start of the emission, the emission wavelength becomes equal to a design value (usually, the same as the wavelength with respect to which an optical system is designed) or alternatively, in worst cases, the emission wavelength does not come to the design value. If, on the other hand, in accordance with the injection locking method, the pulse emission excimer laser light having an emission wavelength the same as the design wavelength thereof and having its bandwidth narrowed to 1 pm or less is injected into a continuous excimer laser, the emission wavelength of the continuous excimer laser can be held at the design wavelength 193 nm thereof, just from start of the emission.

A portion of the laser light outputted from the pulse emission excimer laser 201 is reflected by a semi-transmission mirror 203, and it enters a wavelength monitor 204. The wavelength monitor 204 serves to detect the wavelength of the pulse laser light, and it applies the detection result to an operation unit 202. On the basis of the output of the wavelength monitor 204, the operation unit 202 detects the amount of any deviation of the current center wavelength of the pulse laser light, from the design wavelength. Also, on the basis of the thus detected deviation, the operation unit 202 actuates a band-narrowing element inside the pulse emission excimer laser 201 (for example, it may be a prism, a diffraction grating or an etalon), so as to assure that the center wavelength of the pulse emission excimer laser 201 becomes equal to the design wavelength 193 nm. As a result of this, the pulse laser light whose center wavelength is held at 193 nm can be injected into the continuous emission excimer laser 1. During this injection, a wavelength stabilization mechanism (5, 6, 7, 9) for the continuous emission excimer laser may be operated, such that the center wavelength of the continuous emission excimer laser 1 can be quickly held at the design wavelength 193 nm. After this, the injection locking may be discontinued, as long as the wavelength stabilization mechanism (5, 6, 7, 9) is held in operation, the center wavelength of the laser light outputted from the continuous emission excimer laser 1 can be maintained constant. Thus, in the projection optical system 3 which is a monochromatic lens system, any variation in the optical characteristics thereof such as magnification, focal point position or aberration, for example, due to changes in wavelength of the laser light from the continuous emission excimer laser 1, can be avoided. As a result, a circuit pattern of a reticle can be projected on a wafer W very accurately.

Denoted in FIG. 1 at 5 is a semi-transmission mirror, and denoted at 6 is a wavemeter (first wavelength monitor) for receiving a portion of the laser light, reflected by the semi-transmission mirror 5, to detect the wavelength of laser light. Denoted at 7 is a first operation unit which is operable in response to an output of the wavemeter 6, to detect any deviation of the current center wavelength (as represented by that output) from the design wavelength. Also, the first operation unit 7 is operable to actuate a piezoelectric device 9 on the basis of the detected deviation amount. The wavelength monitor 6, the first operation unit 7 and the piezoelectric device 9 are components of the wavelength stabilization mechanism for stabilizing the emission wavelength of the laser 1. By means of the first operation unit 7 and the piezoelectric device 9, a mirror for resonance of the laser 1 can be minutely oscillated in the optical axis direction to change the resonator length, by which the emission wavelength of the laser 1 can be controlled to the design wavelength and also the emission wavelength of the laser light can be maintained constant. Here, the resonator length refers to the optical path length between a pair of mirrors provided in the laser light source. With this procedure, in the projection optical system 3 which is a monochromatic lens system, any variation in optical characteristics such as magnification, focal point position and aberration, for example, due to changes in wavelength of the laser light can be avoided. Therefore, a circuit pattern of a reticle Re can be projected onto a wafer W very accurately.

In this embodiment, a mirror for the resonator is shifted in the optical axis direction thereby to change the resonator length. However, the resonator length may be changed by changing the pressure of a gas for excitation.

Further, the output of the wavemeter 6 may be applied also to a second operation unit 8, such that any change in optical characteristics of the projection optical system 3 due to a variation in wavelength of the laser light can be corrected by the second operation unit 8 as well as various correcting means. Where such a mechanism is provided, the function of the wavelength stabilization means, including the first operation unit 7 and the piezoelectric device 9, may be omitted. Of course, both mechanisms may be provided and operated.

The second operation unit 8 serves to evaluate the outputs of various sensors (not shown) and to correct any change in optical characteristic of the projection optical system such as magnification, focal point position and aberration, for example, being variable with temperature, humidity, pressure, lens heat generation or heat radiation, for example. The optical characteristic correction may be carried out, for example, by moving lens elements or moving the movable stage 4 in the optical axis direction, by decentering an optical member, or by changing an air pressure between adjacent lens elements. In this embodiment, any other optical characteristic correcting means known in the art may be used.

As an alternative, the wavelength stabilization mechanism and the optical characteristic correcting means may be omitted, and, on the basis of the injection locking method, laser light may be injected continuously into the continuous emission excimer laser 1.

In accordance with this embodiment as described above, because a continuous emission excimer laser needs a long time until, at start of the emission, the emission wavelength is converged to the design wavelength, the injection locking method such as shown in FIG. 1 is used to shorten the convergence time.

In accordance with this embodiment of the present invention, a projection exposure apparatus by which a pattern image of a resolution not broader than 0.09 micron is attainable, is accomplished.

In this case, the excimer laser 1 may be a continuous emission $F_2$ excimer laser having a center wavelength 157 nm, and a half bandwidth 0.1 pm or less, preferably, not greater than 0.08 pm.

Figure 2:
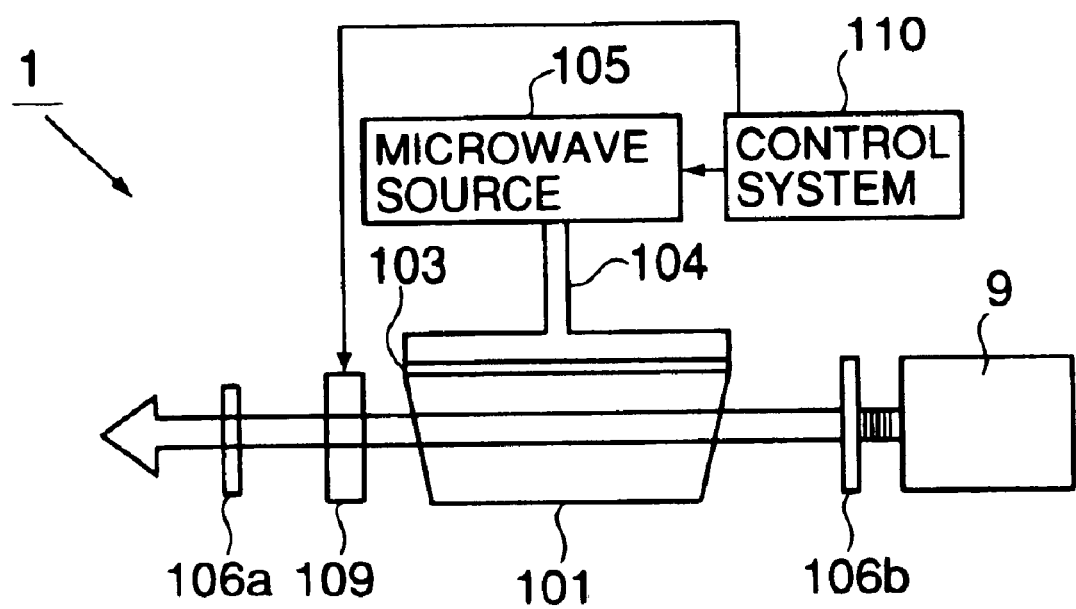
FIG. 2 is a schematic view of a continuous emission laser shown in FIG. 1, as well as some components around it.

FIG. 2 is a schematic view of the continuous emission excimer laser 1 shown in FIG. 1. Denoted at 101 is a laser chamber in which a gas for excitation is sealingly held, and the gas is circulated therein at a high speed. Denoted at 103 is a dielectric member for introducing microwaves into the laser chamber. Denoted at 104 is a microwave guide tube for guiding the microwaves, and denoted at 105 is a microwave emission source for supplying microwaves.

Denoted at 106a is a half mirror which is an output mirror, and denoted at 106b is another mirror. Denoted at 109 is a shutter, and denoted at 110 is a control system for controlling the microwave emission source 105 and the shutter 109. The half mirror 106a and the mirror 106b constitute an optical resonator for the excimer laser 1.

In operation, microwaves generated by the microwave emission source 105 are guided by the microwave guide 104 and, through the dielectric member 103, they continuously excite the excimer laser gas inside the laser chamber 101. Light produced from the thus excited excimer laser gas is reflected by the mirror 106a back to the laser chamber 1, and it causes inductive excitation light emission with the excited excimer laser gas. Light produced thereby advances reciprocally inside the optical resonator (laser resonator), comprising the half mirror 106a and the mirror 106b, and it causes successive stimulated emissions. As a result of this, only light of a predetermined wavelength is amplified. Then, a portion of the thus amplified light is outputted through the half mirror 106a.

Figure 3:
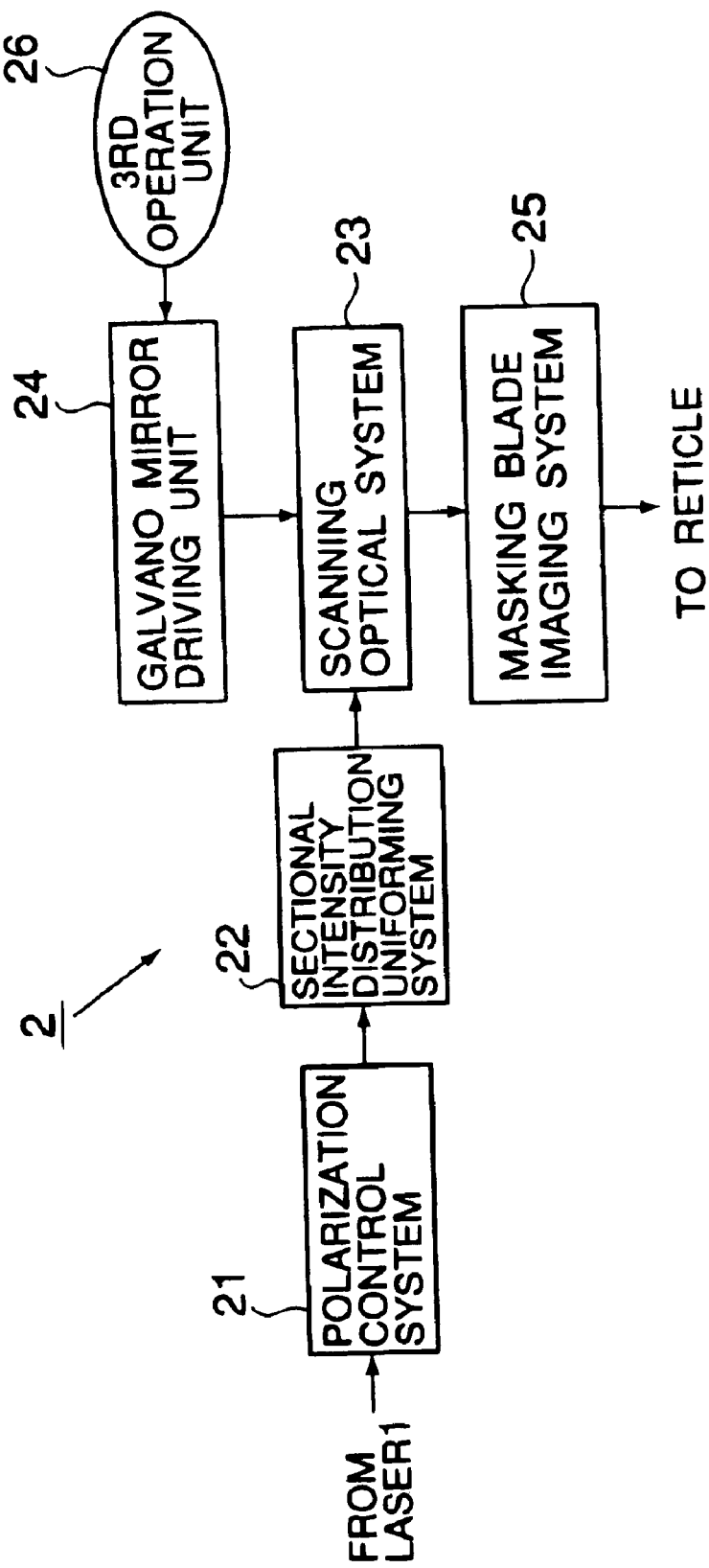
FIG. 3 is a block diagram of a main portion of an illumination system shown in FIG. 1.

FIG. 3 is a block diagram for explaining the structure of the illumination optical system 2 shown in FIG. 1. The illumination optical system 2 illustrated in FIG. 3 is an illumination optical system having plural illumination modes, being arranged so that an appropriate illumination mode (shape or size of an effective light source, for example) can be chosen in accordance with the type of the reticle pattern (size, shape or structure, for example).

In FIG. 3, laser light from the excimer laser 1 (FIG. 1) is divided by a polarization control system 21 into at least two light beams. If it is bisection, for example, the laser beam may be divided into two light beams having mutually orthogonal polarization directions. Laser light which consists of these two light beams, being combined, is received by a sectional intensity distribution uniforming system 22 by which the sectional intensity distribution of the laser light is made uniform. The sectional intensity distribution uniforming system may include at least one of a combination of a fly's eye lens and a lens, and an optical pipe (kaleidoscope). Also, the polarization control system 21 may include a polarization beam splitter for dividing light, for example.

Laser light from the sectional intensity distribution uniforming system 22 is focused by a scanning optical system 23 upon a pupil plane of the illumination optical system 2. Then, one or two galvanic mirrors of the scanning optical system 23, provided for two-dimensional scanning, are actuated and rotated by a driving unit 24, by which a laser light spot formed on the pupil plane of the illumination optical system 2 is scanningly moved. As a result of this, a secondary light source (effective light source) having predetermined shape and size is produced on the pupil plane. The thus produced secondary light source may have a circular shape, a ring-like zone shape having a finite width, or a quadrupole shape, for example. The shape may be chosen automatically or manually in accordance with the type or size of the pattern of the reticle Re. The laser light from the scanning optical system 23 goes through a masking blade imaging system 25, and it impinges on the reticle (not shown). Consequently, the reticle is illuminated with slit-like light having a rectangular or arcuate sectional shape, as described above.

The masking blade imaging system 25 serves to form, upon the reticle, an image of a masking blade which is disposed before or after the above-described pupil plane and held optically conjugate with the reticle, so as to determine the shape of the rectangular or arcuate slit.

Also, the light reflecting position of one or two galvano mirrors provided for the two-dimensional scan and the position of the circuit pattern of the reticle are placed in an optically conjugate relation. Based on these relationships, light beams from plural secondary light sources which are produced successively with rotation of the galvano mirror or mirrors, can be superposedly projected on the same region on the reticle.

The pupil plane of the illumination optical system 2 is disposed in an optically conjugate relation with the pupil plane (aperture stop) of the projection optical system 3. As a result, the light intensity distribution at the pupil plane of the illumination optical system 2 is substantially directly projected on the pupil plane of the projection optical system 3.

Figure 4A:
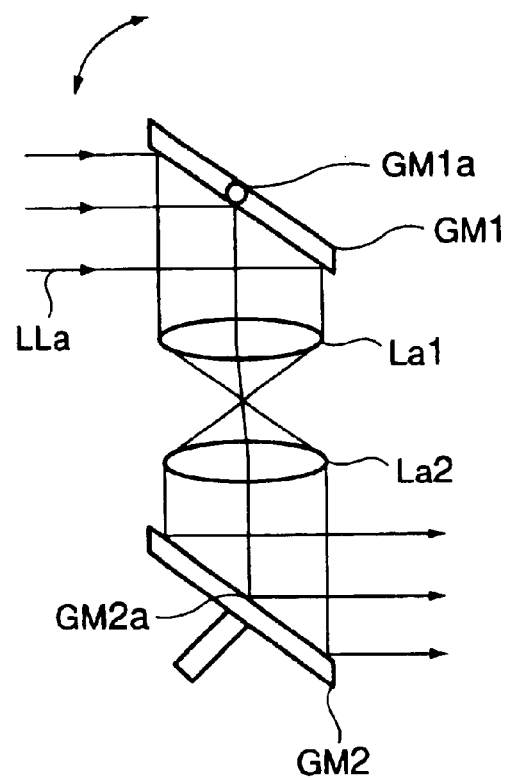
FIGS. 4A and 4B are schematic views, respectively, for explaining a scanning system in an illumination optical system according to the present invention.

FIG. 4A illustrates galvano mirrors GM1 and GM2, in an example wherein the scanning optical system 23 has two galvano mirrors.

In FIG. 4A, the galvano mirror GM1 can oscillate in a direction along the sheet of the drawing, as depicted by an arrow, while the galvano mirror GM2 can oscillate in a direction perpendicular to the sheet of the drawing. By these rotational motions, a parallel light beam LLa being parallel to the optical axis is reflectively deflected, and the deflected light is outputted as a parallel light beam which then goes through a condensing lens system (not shown). With this arrangement, the pupil plane of the illumination optical system is scanned two-dimensionally by a light spot, such that a secondary light source (effective light source) of a desired shape is produced here.

The galvano mirrors GM1 and GM2 have central reflection points GM1a and GM2a, respectively, which are placed approximately in a conjugate relation with each other, with respect to lens systems La1 and La2.

Figure 4B:
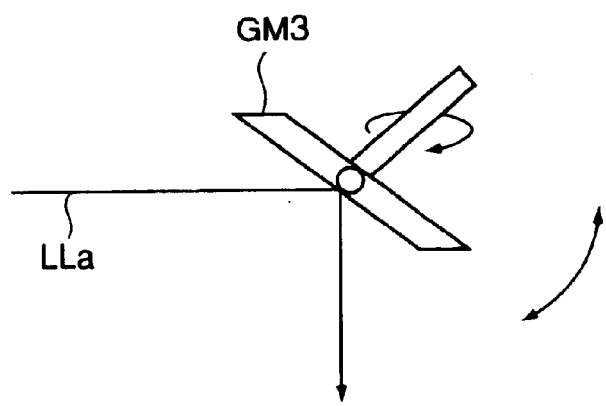

FIG. 4B illustrates a galvano mirror GM3, in an example where the scanning optical system includes a single galvano mirror. In FIG. 4B, the galvano mirror GM3 can oscillate in a direction along the sheet of the drawing and also in a direction perpendicular to the sheet of the drawing, to reflectively deflect a light beam LLa incident thereon. Thus, through a condensing lens system (not shown), the pupil plane of the illumination optical system is scanned two-dimensionally, such that a secondary light source (effective light source) is produced there.

FIGS. 5A–5D are schematic views each illustrates a secondary light source produced on the pupil plane of the illumination optical system by means of the scanning optical system 23.

Figure 5A:
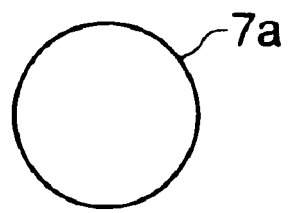
FIGS. 5A, 5B, 5C and 5D are schematic views, respectively, for explaining a secondary light source image upon a pupil plane of an illumination optical system, according to the present invention.
Figure 5C:
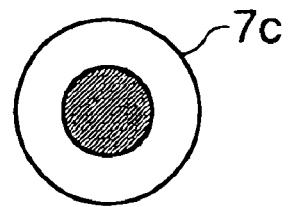
Figure 5B:
Figure 5D:
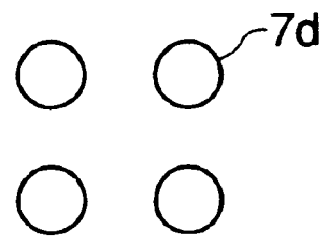

Among these drawings, FIG. 5A shows a circular secondary light source to be used for standard illumination, and it has a sigma value σ being equal to "NA of the illumination optical system" divided by "NA of the projection optical system" of about 0.5 to 0.7. FIG. 5B shows a circular secondary light source having a σ value of about 0.3–0.4, and it can be used for small-σ illumination in a case where a phase shift mask, for example, is used. FIG. 5C shows a secondary light source of a ring-like zone shape. FIG. 5D shows a secondary light source of a quadrupole shape, for quadrupole illumination.

Here, if the scan speed of the reticle Re or wafer W is V (mm/sec), the width of the illumination light (slit) on the reticle is W (mm), and the time necessary for drawing (producing) a secondary light source on the pupil plane once is T (sec), the third operation unit 26 controls the galvano mirror driving unit 24 so as to satisfy the following relation, to scanningly move the laser light spot:

$$W/V = nT \text{ (where n is an integer)} \quad (a)$$

As a result of this, the whole shot region on the wafer can be exposed on the basis of the effective light source of the same shape, such that uniform exposure is assured.

Figure 6:
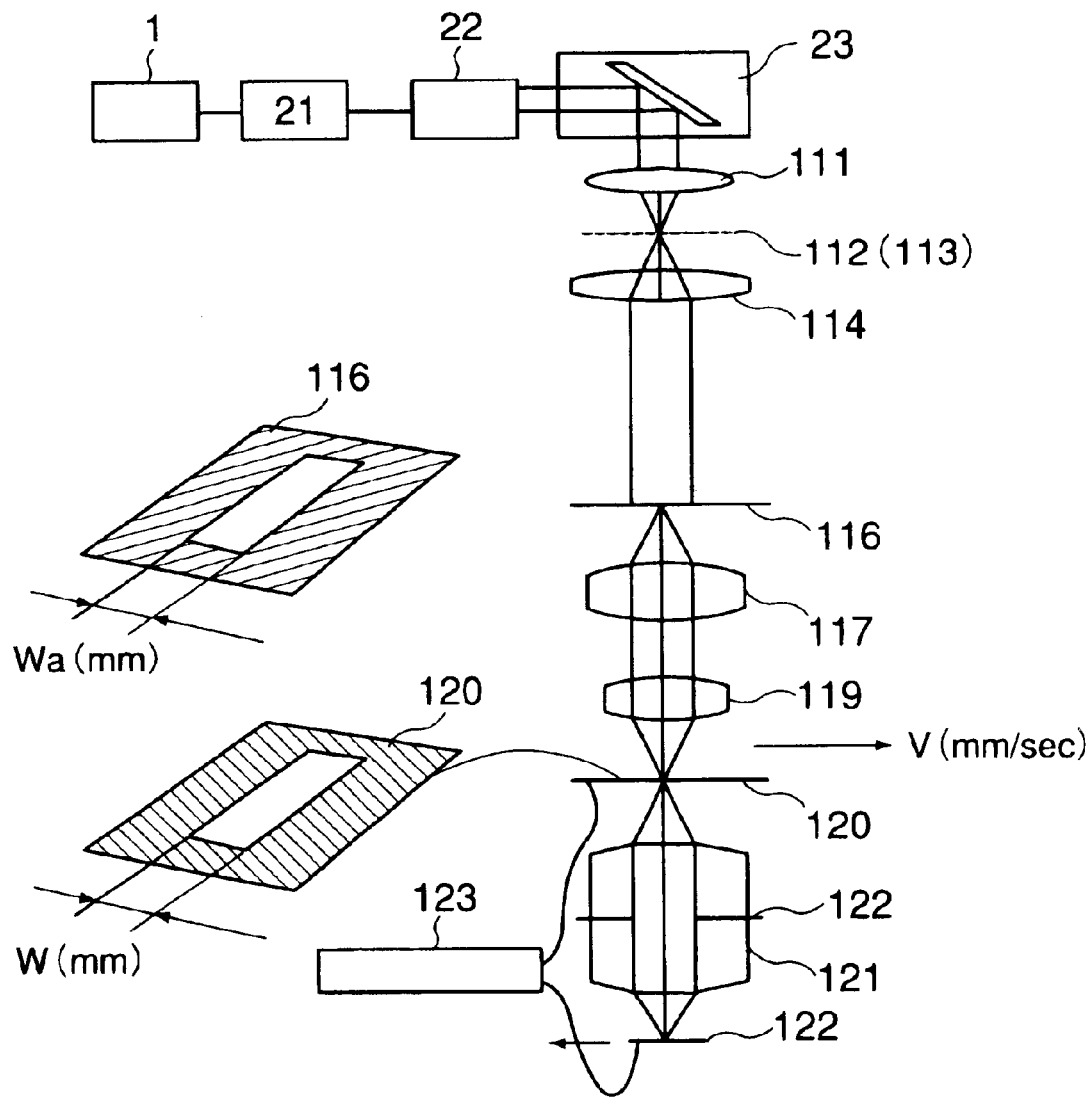
FIG. 6 is a schematic view for explaining a scanning system in an illumination optical system of a projection exposure apparatus according to the present invention, as well as an illumination region upon a reticle.

FIG. 6 illustrates the positional relationship between the scanning optical system 23 and the masking blade imaging system 25 (FIG. 3). In FIG. 6, light from the continuous emission excimer laser 1 goes through the polarization control system 21 and the sectional intensity distribution uniforming system 22, and thereafter, it enters the scanning optical system 23. By means of the scanning optical system 23 and a lens system 111, a secondary light source (effective light source) 112 is produced on the plane 113. The scanning optical system scans the pupil plane of the illumination optical system with the light spot, so as to satisfy equation (a) described above.

Then, through a lens system 114, the light from the secondary light source 112 is projected to Koehler-illuminate a masking blade 116 which includes plural movable blades (light blocking members). The masking blade 116 may have four movable blades in which edges of opposed blades may define a slit-like aperture having a width Wa (mm). The lens system 114 may include a fly's eye lens.

Denoted at 117 is a collimator lens for collecting the light passed through the masking blade 116. Denoted at 119 is a relay lens for collecting the light from the collimator lens 117 and for projecting the light onto a reticle (mask) 120, so that a slit-like illumination region of a width W (mm) is defined thereon. Denoted at 121 is a projection optical system for projecting, in a reduced scale, a pattern formed on the reticle 120 surface onto a wafer (semiconductor substrate) 122.

In this embodiment, the masking blade 116 and the reticle 120 are placed approximately in a conjugate relation with respect to an optical system including the collimator lens 117 and the relay lens 119. Further, the secondary light source plane 113 and the pupil plane 122 of the projection optical system 121 are held approximately in a conjugate relation.

Denoted at 123 is a movement control system, which serves to move, in corporation with a driving unit (not shown), the reticle 120 and the semiconductor substrate (wafer) 122 in directions of arrows, at the same ratio as the magnification of the projection optical system 121 and exactly at constant speeds.

With this procedure, the pattern formed on the reticle 120 is scanningly transferred to the wafer 122.

Figure 7:
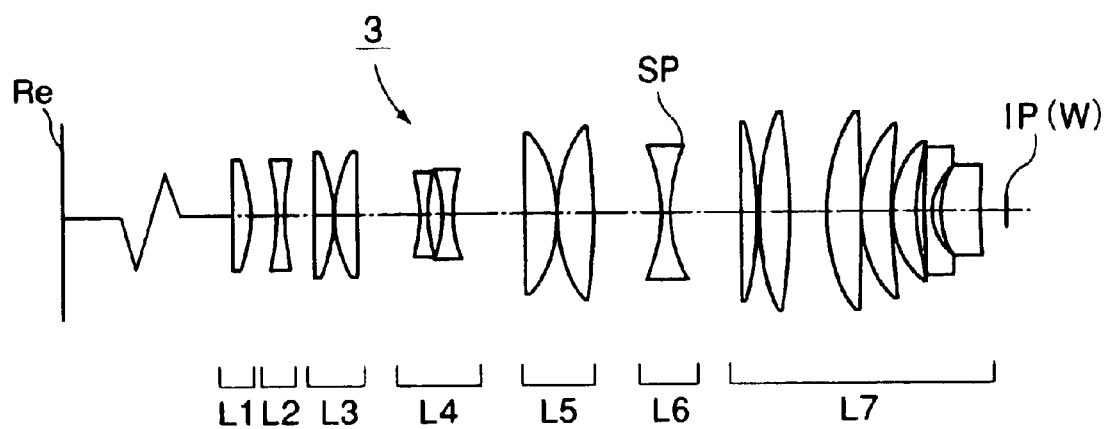
FIG. 7 is a sectional view of a main portion of a lens system of the projection optical system shown in FIG. 1.
Figure 8:
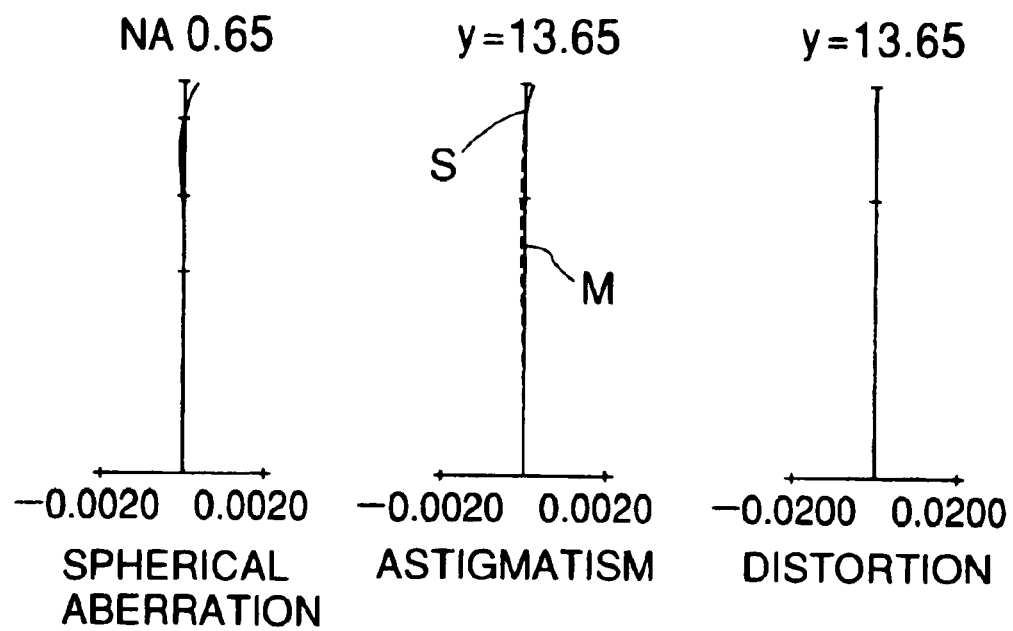
FIG. 8 illustrates aberrations of the lens system of the projection optical system shown in FIG. 1.
Figure 8:
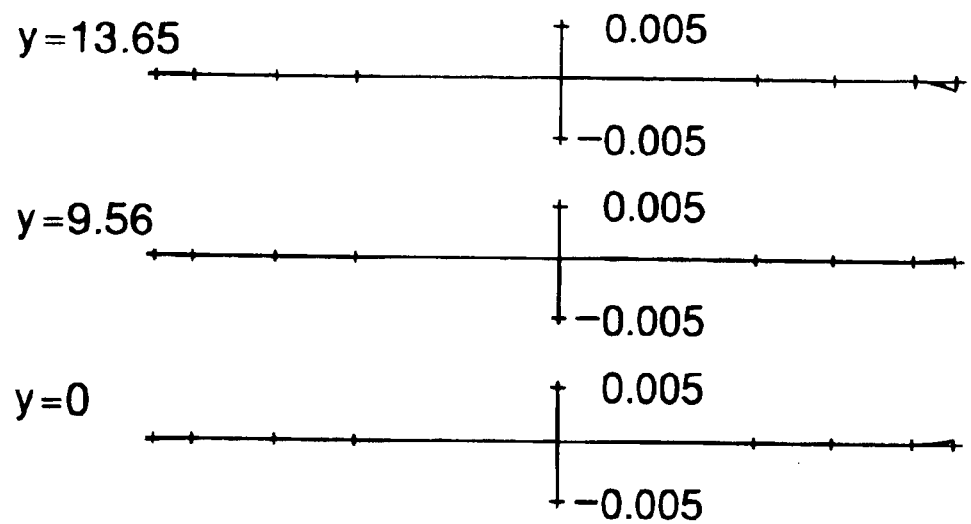

FIG. 7 is a sectional view of a main portion of the lens structure of a projection optical system 3 according to an embodiment of the present invention. FIG. 8 illustrates aberrations of the projection optical system of FIG. 7. In FIG. 8, Y denotes the image height on the wafer W surface, S denotes the sagittal image plane, M denotes the meridional image plane, and NA denotes the numerical aperture.

In the projection optical system of FIG. 7, all the lens elements thereof are made of synthetic quartz ($SiO_2$). It has a projection magnification of ¼. The image side numerical aperture is NA=0.65, and the object-to-image distance (distance from reticle Re to wafer W) is L=1000 mm. The design wavelength is 193 nm and, as regards the field range, the diameter of the exposure region upon the wafer is 27.3 mm. Further, the projection optical system is substantially telecentric, both on the object side (reticle side) and the image plane side (wafer side).

Table 1 below shows the lens data of the projection optical system of FIG. 7.

TABLE 1

| i | ri | di | ni | Obj-distance = 64.400 |
|---|---|---|---|---|
| 1 | 0.000 | 21.483 | 1.56020 | |
| 2 | −234.177 | 32.837 | | |
| 3 | −217.725 | 11.000 | 1.56020 | |
| 4 | 417.996 | 33.850 | | |
| 5 | 0.000 | 22.468 | 1.56020 | |
| 6 | −187.367 | 0.700 | | |
| 7 | 146.395 | 26.864 | 1.56020 | |
| 8 | 2044.065 | 74.989 | | |
| 9 | −217.939 | 11.000 | 1.56020 | |
| 10 | 218.342 | 19.185 | | |
| 11 | −111.200 | 11.000 | 1.56020 | |
| 12 | 162.388 | 83.304 | | |
| 13 | 4095.070 | 42.510 | 1.56020 | |
| 14 | −165.000 | 0.700 | | |
| 15 | 203.723 | 45.738 | 1.56020 | |
| 16 | −760.044 | 82.340 | | |
| 17 | −133.459 | 11.000 | 1.56020 | |
| 18 | 158.694 | 20.034 | | |
| 19 | 0.0(stop) | 68.080 | | |
| 20 | −2375.458 | 19.965 | 1.56020 | |
| 21 | −387.330 | 0.700 | | |
| 22 | 366.325 | 37.399 | 1.56020 | |
| 23 | −613.820 | 45.002 | | |
| 24 | 243.386 | 40.478 | 1.56020 | |
| 25 | −4311.737 | 0.700 | | |
| 26 | 181.915 | 35.797 | 1.56020 | |
| 27 | 981.126 | 0.700 | | |
| 28 | 119.183 | 27.705 | 1.56020 | |
| 29 | 256.810 | 9.045 | | |
| 30 | 770.652 | 11.000 | 1.56020 | |
| 31 | 80.000 | 10.112 | | |
| 32 | 122.097 | 47.000 | 1.56020 | |
| 33 | 275.295 | | | |

| | | | aspherical surfaces | | |
|---|---|---|---|---|---|
| i | K | A | B | C | D |
| 2 | 0.000000e+000 | −1.114212e−007 | 1.060175e−011 | −7.279118e−016 | 4.276504e−020 |
| 3 | 0.000000e+000 | −7.330288e−008 | 1.877977e−011 | −1.654304e−015 | 1.154005e−019 |
| 7 | 0.000000e+000 | 1.794366e−008 | −1.746620e−012 | 2.819556e−016 | −1.250857e−020 |
| 11 | 0.000000e+000 | −1.072701e−007 | −1.342596e−012 | 7.030022e−016 | 5.449568e−020 |
| 17 | 0.000000e+000 | −1.232061e−008 | 1.881593e−012 | 2.948112e−017 | −2.584618e−021 |
| 23 | 0.000000e+000 | 5.143208e−009 | 1.895658e−013 | −2.954221e−018 | 5.204719e−023 |
| 32 | 0.000000e+000 | 2.598613e−008 | 5.141410e−012 | −1.743487e−016 | 4.963194e−020 |

| i | E | F | G |
|---|---|---|---|
| 2 | −7.962637e−025 | 0.000000e+000 | 0.000000e+000 |
| 3 | −3.636200e−024 | 0.000000e+000 | 0.000000e+000 |
| 7 | 4.866995e−025 | 0.000000e+000 | 0.000000e+000 |
| 11 | 5.143056e−023 | 0.000000e+000 | 0.000000e+000 |
| 17 | 1.229520e−026 | 0.000000e+000 | 0.000000e+000 |
| 23 | −5.427645e−028 | 0.000000e+000 | 0.000000e+000 |
| 32 | −1.947370e−023 | 0.000000e+000 | 0.000000e+000 |

In Table 1, ri is the curvature radius of the i-th surface in an order from the object side (reticle side), di is the lens thickness of the i-th lens or the air spacing between the i-th and (i+1) th lenses, in an order from the object side, and ni is the refractive index of the glass of the i-th lens in an order from the object side.

Here, an aspherical shape is given by the following equation:

$$X = \frac{\frac{H^2}{r_i}}{1+\left(1-(1+k)\cdot\left(\frac{H}{n}\right)^2\right)^{\frac{1}{2}}} + A\cdot H^4 + B\cdot H^6 + C\cdot H^8 + D\cdot H^{10} + E\cdot H^{12} + F\cdot H^{14} + G\cdot H^{16} + \ldots$$

wherein X is the amount of displacement from the lens vertex in the optical axis direction, H is the distance from the optical axis, ri is the curvature radius, k is the conical constant, and A–G are aspherical coefficients.

The refractive index of quartz with respect to the exposure wavelength of 193 nm is 1.5602. Also, the local curvature power P of an aspherical surface is given by the following equation, while taking the aforementioned aspherical surface equation X as the function of X(H).

$$PH = \frac{N'-N}{\rho}$$

$$\text{where } \rho = \frac{(1+X'^2)^{\frac{3}{2}}}{X''}$$

wherein N and N' are the refractive indices of media before and after the refraction surface.

The projection optical system of FIG. 7 comprises, in an order from the reticle Re side, a first lens group L1 having a positive refractive power, a second lens group L2 having a negative refractive power, a third lens group L3 having a positive refractive power, a fourth lens group L4 having a negative refractive power, a fifth lens group L5 having a positive refractive power, a sixth lens group L6 having a negative refractive power, and a seventh lens group L7 having a positive refractive power. It uses seven aspherical surfaces.

The first lens group L1 comprises a single positive lens with an aspherical surface, and it has a flat-convex shape with its convex surface facing to the image side (wafer side). The aspherical surface at r2 includes a region in which the local curvature power changes in a positive direction. With this aspherical surface, mainly a positive distortion aberration (distortion) is produced, which is contributable to correction of distortion.

The second lens group L2 comprises a single aspherical surface negative lens, having a biconcave shape (i.e., both lens surfaces have a concave shape). The aspherical surface at r3 includes a region in which the local curvature power changes in a negative direction. Also, with respect to the surface r2 of the lens group L1, it includes a region in which the local curvature power changes in an opposite direction.

The third lens group L3 comprises, in an order from the object side, a positive lens of a flat-convex shape and having a convex surface facing to the image side, as well as an aspherical positive lens of an approximately flat-convex shape and having a convex surface facing to the object side.

The fourth lens group L4 comprises, in an order from the object side, a negative lens of a biconcave shape, and a negative lens with an aspherical surface and having a biconcave shape. The aspherical surface at r11 includes a region in which the local curvature power changes in a negative direction. Also, with respect to the surface r2 of the lens group L1, it includes a region in which the local curvature power changes in an opposite direction. This aspherical surface is effective mainly to assure well-balanced correction of the image field aberration and coma, for example.

The fifth lens group L5 comprises, in an order from the object side, a positive lens of an approximately flat-convex shape and having a convex surface facing to the image side, as well as a positive lens of a biconvex shape (i.e., both lens surfaces have a convex shape).

The sixth lens group L6 comprises a single negative lens with an aspherical surface, and having a biconcave shape. With this aspherical surface, mainly, spherical aberration and coma to be produced by a strong negative refracting power can be corrected effectively.

The seventh lens group L7 comprises, in an order from the object side, (i) a positive lens of a meniscus shape and having a convex surface facing to the image side, (ii) a positive lens with an aspherical surface and having a biconvex shape, (iii) a positive lens of an approximately flat-convex shape and having a convex surface facing to the object side, (iv) two positive lenses of a meniscus shape and having a convex surface facing to the object side, (v) a negative lens of a meniscus shape and having a concave surface facing to the image side, and (vi) a positive lens of a meniscus shape and having a convex surface facing to the object side. In this seventh lens group L7, the aspherical surface where an axial light flux, which is a light flux emitted from the axis upon the object surface, is used at a higher position, serves mainly to correct a negative spherical aberration to be produced by the seventh lens group that has a strong positive refracting power. Also, the aspherical surface, used at the convex surface adjacent the image plane, is contributable mainly to assure well-balanced correction of the coma and distortion.

In accordance with the projection optical system of this embodiment, aspherical surface lenses are introduced at five surfaces, particularly, before the stop SP (reticle side). Mainly, this enables well-balanced and effective correction of the distortion, astigmatism and coma, for example. Further, a surface which is very influential to abaxial chief rays is formed by an aspherical surface, this being very effective mainly to correct aberrations related to abaxial rays and also being effective to reduce burdens for correction of other aberrations. This assures a good optical performance. Seven aspherical surface lenses are used in this embodiment, by which an optical system comprising sixteen lens elements in total is accomplished while satisfying a large numerical aperture NA, on the other hand.

As regards the glass material of the projection optical system according to the present invention, $CaF_2$ as well as $BaF_2$ and $MgF_2$, for example, are usable.

The projection optical system shown in FIG. 7 comprises a monochromatic lens system in which all the lens elements are made of synthetic quartz ($SiO_2$). However, in the projection optical system of FIG. 7, one or two lens elements of the seventh lens group L7, which are closest to the wafer, or a cover glass member (not shown) used therein, may be made of fluorite ($CaF_2$). This improves the durability of the lens system. Thus, in the present invention, those referred to by the words "a lens system comprising a substantially single glass material" include lens systems in which a slightly different material or materials are used, such as described above.

Further, as regards the method of changing the resonator length, in place of displacing a mirror, the pressure of a gas for excitation may be changed.

Further, the present invention is applicable also to a step-and-repeat type projection exposure apparatus for manufacture of various devices such as semiconductor devices, liquid crystal devices, image pickup devices, or magnetic heads, for example.

Where a $F_2$ excimer laser is used, among the materials mentioned above, those other than quartz, that is, $CaF_2$ only or $BaF_2$ and $MgF_2$ may be used.

Next, an embodiment of a semiconductor device manufacturing method, which uses a projection exposure apparatus such as described above, will be explained.

Figure 9:
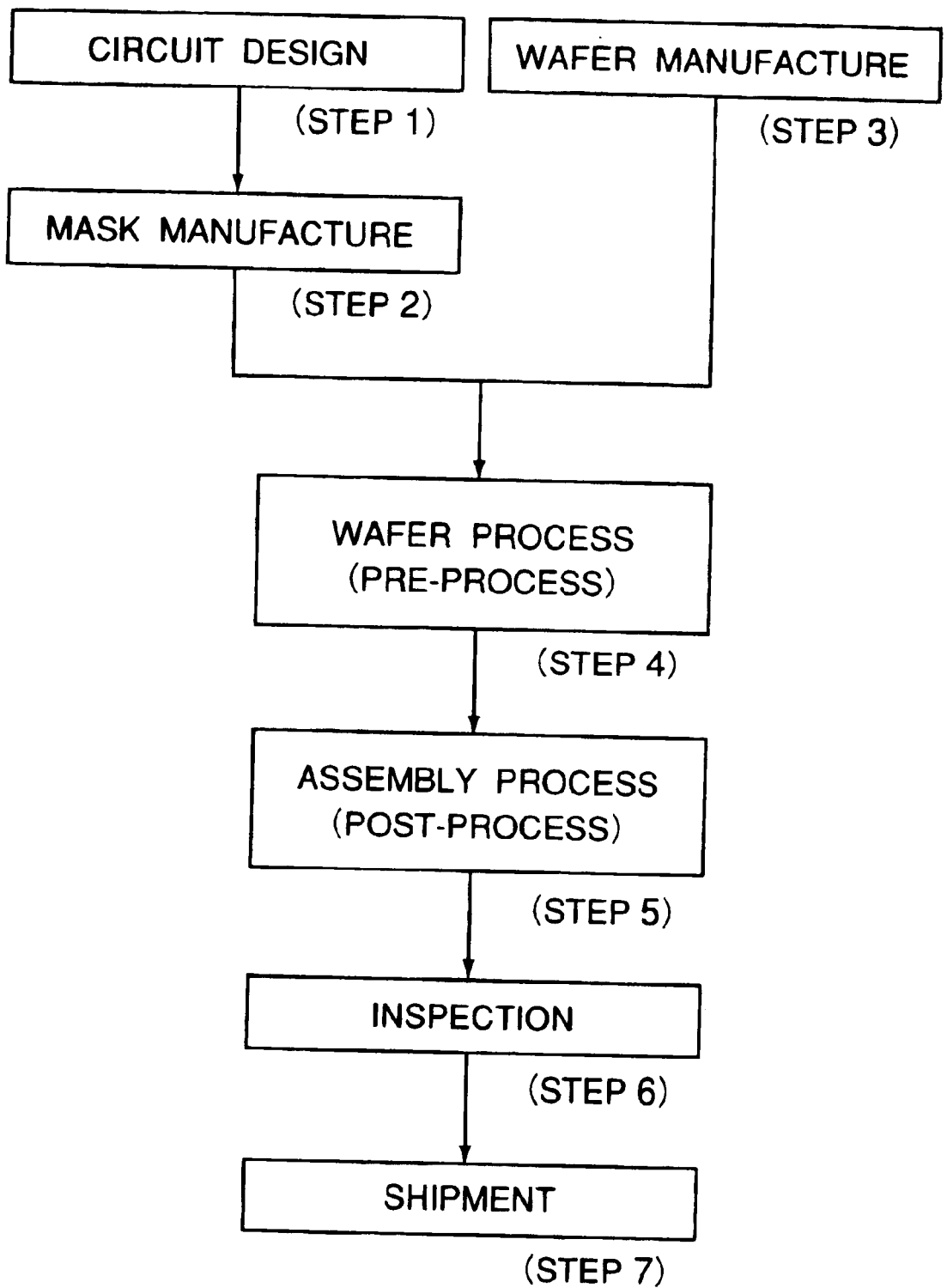
FIG. 9 is a flow chart for explaining device manufacturing processes according to an embodiment of the present invention.

FIG. 9 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 10:
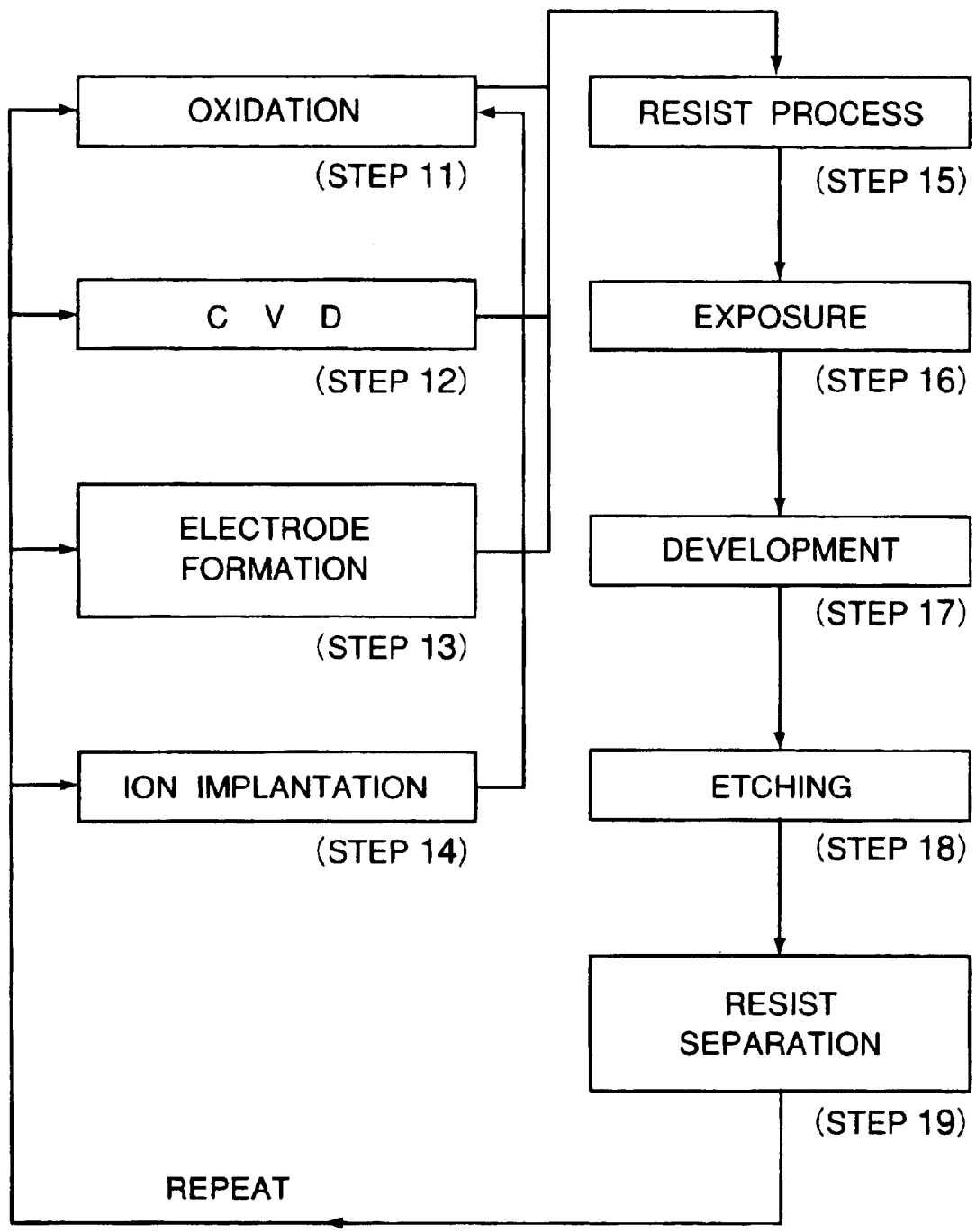
FIG. 10 is a flow chart for explaining details of a wafer process in the procedure shown in FIG. 9.

FIG. 10 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the device manufacturing method of this embodiment described above, semiconductor devices of high density can be produced easily.

In accordance with the present invention, just from start of the light emission, the emission wavelength of a continuous emission excimer laser can be held at the design wavelength, such that the projection exposure process can be attained with a good throughput. Further, even by use of a monochromatic lens as a projection optical system, a pattern of the reticle can be projected on a substrate very accurately.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

a continuous emission excimer laser, having a resonator, for providing laser light;

an illumination optical system for receiving the laser light from the continuous emission excimer laser and for illuminating a pattern of a reticle with the laser light;

a projection optical system, comprising a lens system made of a substantially single glass material, for projecting the illuminated pattern of the reticle onto a substrate;

an injection laser for injecting light into the resonator of said continuous emission excimer laser, wherein a design wavelength of the injection laser is equal to a design wavelength of the continuous emission excimer laser;

a wavemeter for measuring the wavelength of the laser light from said continuous emission excimer laser and for producing a signal; and changing means for changing a resonator length of said continuous emission excimer laser on the basis of the signal from said wavemeter so that the wavelength of the laser light from said continuous emission excimer laser becomes equal to the design wavelength of the continuous emission excimer laser.

2. An apparatus according to claim 1, wherein said injection laser comprises a pulse emission excimer laser including a resonator having a band narrowing element, said apparatus further comprises (i) a wavemeter for measuring the wavelength of light from said pulse emission excimer laser and for producing a signal and (ii) an actuator, wherein said actuator actuates the band narrowing element in the resonator of said pulse emission excimer laser on the basis of the signal from said wavemeter so that the wavelength of said pulse emission excimer laser becomes equal to the predetermined wavelength.

3. An apparatus according to claim 1, wherein said changing means includes at least one of shifting means for shifting a mirror in said resonator and pressure changing means for changing a pressure of an excitation gas.

4. An apparatus according to claim 1, wherein the reticle is illuminated with slit-like light having one of a rectangular shape and an arcuate shape, and wherein said apparatus further comprises scanning means for scanningly moving the reticle and the substrate relative to the slit-like light and to said projection optical system such that the substrate is exposed to the pattern of the reticle.

5. An apparatus according to claim 1, wherein the half bandwidth of the wavelength spectrum of the laser light is not greater than 0.1 pm, and an image of a linewidth of 0.13 micron can be produced.

6. An apparatus according to claim 1, wherein the half bandwidth of the wavelength spectrum of the laser light is not greater than 0.08 pm, and an image of a linewidth of 0.09 micron can be produced.

7. An apparatus according to claim 1, wherein said excimer laser is an ArF excimer laser, and the glass material is $SiO_2$.

8. An apparatus according to claim 1, wherein said excimer laser is an $F_2$ excimer laser, and the glass material is one of $CaF_2$, $BaF_2$ and $MgF_2$.

9. An apparatus according to claim 1, wherein said lens system includes lens elements of a number not less than ten, and a first one or first two lens elements of the lens system in an order from the substrate side are made of one of $CaF_2$, $BaF_2$ and $MgF_2$.

10. A device manufacturing method comprising the steps of:

exposing a substrate to a device pattern by use of a projection exposure apparatus as recited in claim 1; and developing the exposed substrate.

* * * * *

UNITED STATES PATENT AND TRADEMARK OFFICE
CERTIFICATE OF CORRECTION

PATENT NO. : 6,853,442 B2
DATED : February 8, 2005
INVENTOR(S) : Chidane Ouchi

It is certified that error appears in the above-identified patent and that said Letters Patent is hereby corrected as shown below:

Column 1,
Line 12, "method" should read -- method, --.
Line 13, "at" should read -- in --.
Line 14, "specifically" should read -- specifically, --.
Line 16, "CCD," should read -- CCDs, -- and "panel," should read -- panels, --.
Line 23, "liquid" should read -- a liquid --.
Line 24, "(Japanese" should read -- (see, e.g., Japanese --.
Line 34, "of" should read -- having --.
Line 35, "it," should read -- this, --.
Line 36, "maybe" should read -- may be --.
Line 45, "on" should read -- onto --.
Line 48, "start" should read -- a start --.
Line 56, "start" should read -- the start --.
Line 60, the second occurrence of "of" should read -- having --.

Column 2,
Line 52, "0.13 micron" should read -- of 0.13 micron --.
Line 53, "production" should read -- the production --.
Line 58, "continuous" should read -- a continuous -- and "193 nm." should read -- of 193 nm. --.
Line 59, "0.2 pm" should read -- of 0.2 pm --.
Line 63, "use" should read -- the use --.

Column 3,
Line 17, "193 nm" should read -- of 193 nm --.
Line 22, "cases" should read -- cases, --.
Line 23, "start" should read -- a start --.
Line 34, "start" should read -- a start --.
Line 51, "193 nm." should read -- of 193 nm. --.
Line 58, "193" should read -- of 193 --.
Line 64, "system 3" should read -- system 3, --.

UNITED STATES PATENT AND TRADEMARK OFFICE
CERTIFICATE OF CORRECTION

PATENT NO. : 6,853,442 B2
DATED : February 8, 2005
INVENTOR(S) : Chidane Ouchi

It is certified that error appears in the above-identified patent and that said Letters Patent is hereby corrected as shown below:

Column 4,
Line 8, "unit" should read -- unit, --.
Line 26, "system 3" should read -- system 3, --.
Line 27, "characteristics" should read -- characteristics, --.
Line 29, "light" should read -- light, --.
Line 41, "Where" should read -- When --.
Line 55, "an" should be deleted.
Line 65, "embodiment" should read -- embodiment, --.
Line 67, "start" should read -- a start --.

Column 5,
Line 5, "apparatus" should read -- apparatus, --.
Line 9, "157" should read -- of 157 --.
Line 10, "0.1 pm" should read -- of 0.1 pm --.
Line 20, the first occurrence of "mirror" should read -- mirror, --.
Line 37, "of" should read -- having --.
Line 50, "bisection," should read -- bisected, --.
Line 55, "sectional" should read -- section --.
Line 65, "galvanic" should read -- galvano --.

Column 6,
Line 3, "pre-" should read -- a pre- --.
Line 13, "arcuate" should read -- an arcuate --.
Line 17, "blade" should read -- blade, --.
Line 25, "sources" should read -- sources, --.
Lines 27 and 35, "on" should read -- onto --.
Line 44, "drawing." should read -- drawings. --.
Line 47, "beam" should read -- beam, --.
Line 59, "where" should read -- wherein --.

Column 7,
Line 1, "illustrates" should read -- illustrating --.
Line 7, "to" should read -- to the --.
Line 8, "by" should read -- by the --.
Line 11, "where" should read -- wherein --.
Line 43, "blade 116" should read -- blade 116, --.
Line 66, "corporation" should read -- cooperation --.

UNITED STATES PATENT AND TRADEMARK OFFICE
CERTIFICATE OF CORRECTION

PATENT NO. : 6,853,442 B2
DATED : February 8, 2005
INVENTOR(S) : Chidane Ouchi

It is certified that error appears in the above-identified patent and that said Letters Patent is hereby corrected as shown below:

Column 8,
Line 1, "arrows," should read -- the arrow, --.
Line 20, "(SiO2)." should read -- ($SiO_2$) --.
Table 1,
"6    -187.367    0.700" should read
-- 6   -187.357    0.700 --.
Table 1,
"7    -146.395    26.864    1.56020" should read
-- 7   -146.365    26.864    1.56020 --.
Table 1,
"10   218.342    19.185" should read
-- 10  218.942    19.185 --.
Table 1,
"15   203.723    45.738    1.56020" should read
-- 15  203.723    45.798    1.56020 --.
Table 1,
"17   -133.459   11.000    1.56020" should read
-- 17  -193.459   11.000    1.56020 --.
Table 1,
"18   158.694    20.034" should read
-- 18  188.694    20.034 --.
Table 1,
"20   -2375.458  19.965    1.56020" should read
-- 20  -2875.458  19.965    1.56020 --.
Table 1,
"21   -387.330   0.700" should read
-- 21  -387.830   0.700 --.

Column 9,
Lines 30-34, " $X = \dfrac{\dfrac{H^2}{r_i}}{1 + \left(1 - (1+k) \cdot \left(\dfrac{H}{R}\right)^2\right)^{\frac{1}{2}}} + A \cdot H^4 + B \cdot H^6 +$ " should read -- $X = \dfrac{\dfrac{H^2}{r_i}}{1 + \left(1 - (1+k) \cdot \left(\dfrac{H}{r_i}\right)^2\right)^{\frac{1}{2}}} + A \cdot H^4 + B \cdot H^6 +$ --.

UNITED STATES PATENT AND TRADEMARK OFFICE
CERTIFICATE OF CORRECTION

PATENT NO. : 6,853,442 B2
DATED : February 8, 2005
INVENTOR(S) : Chidane Ouchi

It is certified that error appears in the above-identified patent and that said Letters Patent is hereby corrected as shown below:

Column 9 (cont'd),
Line 54, "media" should read -- the media --.

Column 10,
Line 25, "mainly" should read -- mainly, --.

Column 11,
Line 11, "adjacent" should read -- adjacent to --.
Line 48, "manufacture" should read -- the manufacture --.
Line 51, "Where a" should read -- When a --.
Line 52, "only" should read -- only, --.
Line 53, "$MgF_2$" should read -- $MgF_2$, --.

Column 12,
Line 1, "step" should read -- step. --.
Line 6, "an" should read -- and --.
Line 31, "start" should read -- a start --.

Signed and Sealed this

Twenty-seventh Day of September, 2005

JON W. DUDAS
*Director of the United States Patent and Trademark Office*